(12) United States Patent
Hu et al.

(10) Patent No.: US 7,753,568 B2
(45) Date of Patent: Jul. 13, 2010

(54) LIGHT-EMITTING DIODE ASSEMBLY AND METHOD OF FABRICATION

(75) Inventors: Tseng-Hsiang Hu, Taipei Hsien (TW); Yeu-Lih Lin, Taipei Hsien (TW); Li-Kuang Tan, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 32 days.

(21) Appl. No.: 11/626,041

(22) Filed: Jan. 23, 2007

(65) Prior Publication Data

US 2008/0175008 A1    Jul. 24, 2008

(51) Int. Cl.
*F21V 25/06* (2006.01)

(52) U.S. Cl. ............... 362/373; 362/294; 362/547

(58) Field of Classification Search .......... 362/373, 362/547, 218, 294; 361/700, 707; 257/714, 257/715; 174/15.2; 165/80.4
See application file for complete search history.

(56) References Cited

U.S. PATENT DOCUMENTS

| | | | | |
|---|---|---|---|---|
| 3,143,592 | A | * | 8/1964 | August ............... 174/16.3 |
| 5,269,372 | A | * | 12/1993 | Chu et al. ............ 165/80.4 |
| 5,632,551 | A | * | 5/1997 | Roney et al. ......... 362/485 |
| 5,857,767 | A | * | 1/1999 | Hochstein ............ 362/294 |
| 5,870,823 | A | * | 2/1999 | Bezama et al. ....... 29/848 |
| 6,517,218 | B2 | * | 2/2003 | Hochstein ............ 362/294 |
| 6,573,536 | B1 | * | 6/2003 | Dry ..................... 257/88 |
| 6,864,513 | B2 | | 3/2005 | Lin et al. |
| 6,880,956 | B2 | * | 4/2005 | Zhang ................. 362/264 |
| 2004/0041757 | A1 | | 3/2004 | Yang et al. |
| 2005/0062059 | A1 | | 3/2005 | Huang |
| 2005/0099775 | A1 | * | 5/2005 | Pokharna et al. ..... 361/700 |
| 2005/0168990 | A1 | | 8/2005 | Nagata et al. |

FOREIGN PATENT DOCUMENTS

| | | | |
|---|---|---|---|
| CN | 02142483.7 | | 3/2004 |
| JP | 01077521 A | * | 3/1989 |
| JP | 06049653 A | * | 2/1994 |
| TW | 595288 | | 6/2004 |
| TW | I234302 | | 6/2005 |
| WO | WO 90/09037 | * | 2/1990 |

* cited by examiner

*Primary Examiner*—Sharon E Payne
(74) *Attorney, Agent, or Firm*—Jeffrey T. Knapp

(57) ABSTRACT

A light-emitting diode (LED) assembly includes a heat dissipation device (30) and at least one LED (10). The heat dissipation device has a connecting surface (33) with circuitry (20) being directly formed thereon. The at least one LED is electrically connected with the circuitry, and is maintained in thermal and mechanical contact with the connecting surface to dissipate heat generated thereby through the heat dissipation device. A method for making the LED assembly includes steps of: (A) providing a heat dissipation device having a surface for the LED to be mounted thereon; (B) insulating the surface; (C) forming circuitry on the insulated surface directly to obtain a connecting surface; (D) attaching the LED to the connecting surface of the heat dissipation device thermally and mechanically, and connecting the LED with the circuitry electrically to form the LED assembly.

1 Claim, 10 Drawing Sheets

US 7,753,568 B2

LIGHT-EMITTING DIODE ASSEMBLY AND METHOD OF FABRICATION

BACKGROUND OF THE INVENTION

1. Field of the Invention

The present invention relates generally to light-emitting diode (LED) assemblies, and more particularly to an LED assembly with improved heat dissipation ability so that heat generated by the LEDs of the assembly can be effectively removed. The present invention relates also to a method for making the LED assembly.

2. Description of Related Art

Light-emitting diode (LED) is a highly efficient light source currently used widely in such field as automobiles, screen displays, and traffic light indicators. When the LED gives off light, heat is also produced.

Generally an LED assembly includes a plurality of LEDs mounted on and electronically connected with a printed circuit board (PCB). A heat sink made of metal, such as aluminum or copper, is arranged under the PCB to remove the heat generated by the LEDs. To reduce thermal resistance between the heat sink and the PCB, thermal interface material, such as thermal grease, is often applied between the heat sink and the PCB. However, the thermal grease has a heat transfer coefficient generally not larger than 5 W/(m·K), which is much smaller than that of the metal. Furthermore, as the PCB is made of FR-4, which is produced by glass fiber impregnation into ethoxyline, thermal resistance of the PCB is very large. The heat generated by the LEDs is thus is only very slowly transferred to the heat sink through the PCB and the thermal grease. The heat thus cannot be rapidly and efficiently removed, which results in significant reductions in the lifespan of the LEDs.

Therefore, it is desirable to provide an LED assembly wherein one or more of the foregoing disadvantages may be overcome or at least alleviated.

SUMMARY OF THE INVENTION

The present invention relates, in one aspect, to a light-emitting diode (LED) assembly. The LED assembly includes a heat dissipation device and at least one LED. The heat dissipation device has a connecting surface with circuitry directly formed thereon. The at least one LED is electrically connected to the circuitry, and is maintained in thermal and mechanical contact with the connecting surface to dissipate heat through the heat dissipation device.

The present invention relates, in another aspect, to a method of making the LED assembly. The method includes steps of: (A) providing a heat dissipation device having a surface for the LED to be mounted thereon; (B) insulating the surface by applying an insulating layer thereon; (C) forming circuitry on the insulating layer thereby obtaining a connecting surface; (D) attaching the LED to the connecting surface of the heat dissipation device thermally and mechanically, and connecting the LED with the circuitry electrically to form the LED assembly.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present light-emitting diode (LED) assembly can be better understood with reference to the following drawings. The components in the drawings are not necessarily drawn to scale, the emphasis instead being placed upon clearly illustrating the principles of the present LED assembly. Moreover, in the drawings, like reference numerals designate corresponding parts throughout the several views.

DETAILED DESCRIPTION OF THE INVENTION

Figure 1:
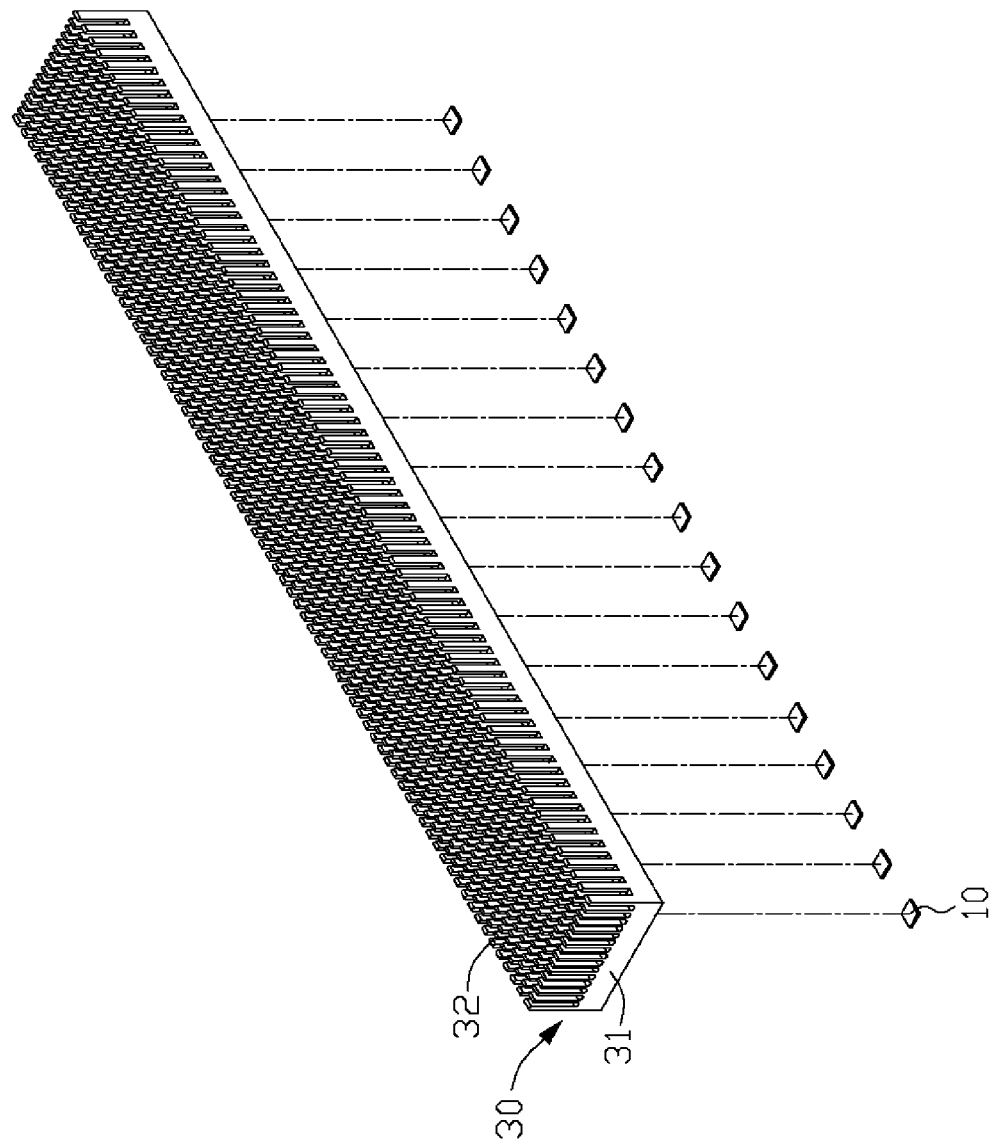
FIG. 1 is an exploded, isometric view of an LED assembly in accordance with a first embodiment of the present invention.
Figure 2:
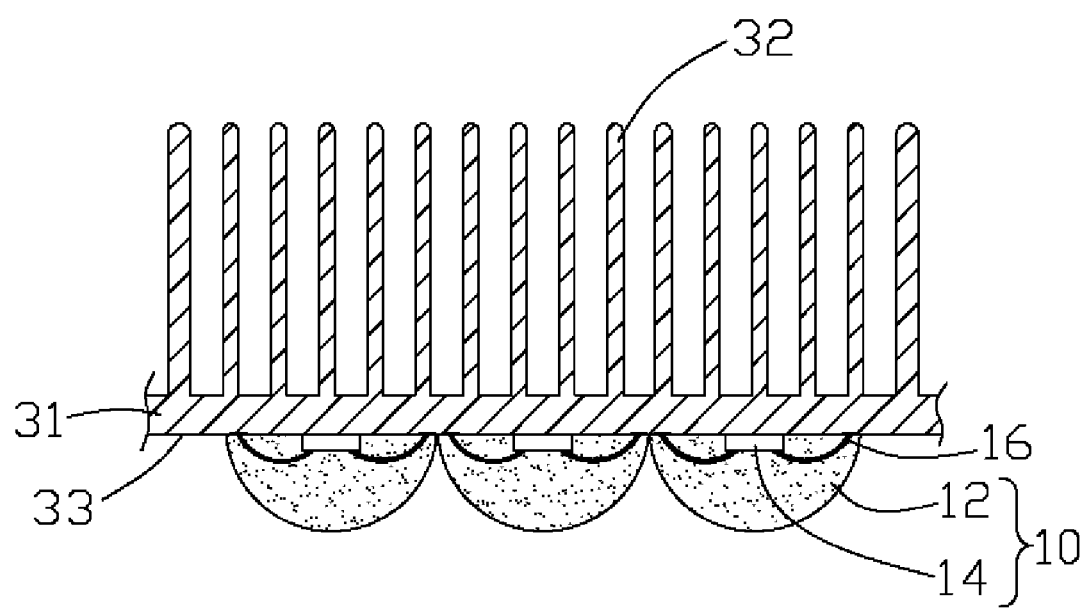
FIG. 2 is a cross-sectional view of the LED assembly of FIG. 1 taken along a traverse direction thereof.

FIGS. 1-2 illustrate a light-emitting diode (LED) assembly in accordance with a first embodiment of the present invention. The LED assembly includes a plurality of LEDs 10, and a heat dissipation device for removing heat generated by the LEDs 10. In this embodiment, the heat dissipation device is a fin-type heat sink 30. The heat sink 30 is made of highly thermally conductive material, such as copper, aluminum, or their alloys. The heat sink 30 as shown in this embodiment is an extruded aluminum heat sink, including a chassis 31 and a plurality of pin fins 32 extending upwardly from the chassis 31. Apparently, the fins 32 are used for increasing the heat dissipation area of the heat sink 30. Alternatively, the fins 32 can be flat shaped. The fins 32 and the chassis 31 can be formed separately, and then connected together by soldering.

Figure 3:
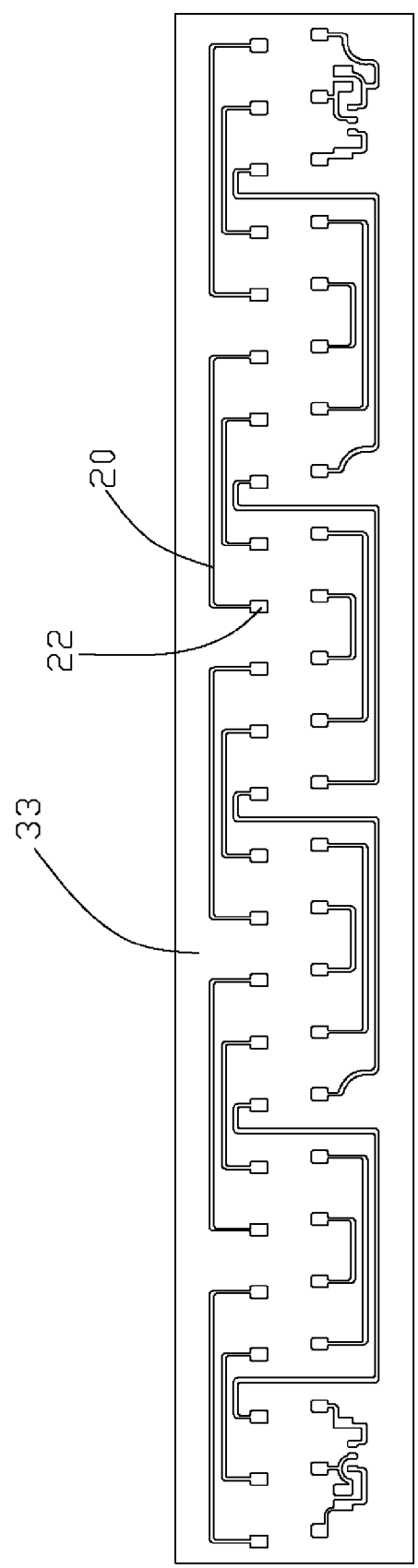
FIG. 3 is a is a sketch indicating circuitry of the LED assembly of FIG. 1.

Referring also to FIG. 3, a bottom surface of the chassis 31 of the heat sink 30 forms a connecting surface 33 for the LEDs 10 to be mounted thereon. Circuitry 20 is directly formed on the connecting surface 33 of the chassis 31. It is to be understood that the circuitry 20 is formed according to the number and mode of the LEDs 10, and is not limited to this embodiment. Each LED 10 includes an LED die 14 being electrically connected with the circuitry 20, and a packaging layer 12 being provided to encapsulate the LED die 14. The packaging layer 12 can transmit light and is generally made of polymeric material such as resin. The packaging layer 12 also functions to firmly secure the LED die 14 in place. When the LEDs 10 are mounted on the heat sink 30, the LED dies 14 are directly attached to the connecting surface 33 of the heat sink 30, and are electrically connected with the circuitry 20 of the connecting surface 33 of the heat sink 30 through wire bonding or flip chip. In this embodiment, the LED dies 14 are electrically connected with the circuitry 20 through wire bonding, in which a pair of gold threads 16 of each LED 10 are electrically connected with contacts 22 of the circuitry 20 of the heat sink 30.

Since the circuitry 20 is directly formed on the connecting surface 33 of the chassis 31 of the heat sink 30, the LED dies 14 are maintained in thermal and mechanical contact with the chassis 31 of the heat sink 30. The heat resistance formed either between the LEDs 10 and the printed circuit board (PCB), or between the PCB and the heat sink 30 of a conventional LED assembly is thus avoided. During operation, the heat generated by the LEDs 10 can be directly and timely transferred to the chassis 31, and then dissipated to ambient air through the fins 32 rapidly and efficiently. In this way the heat of the LEDs 10 can be quickly removed, thus significantly improving lifespan of the LEDs 10.

Figure 4:
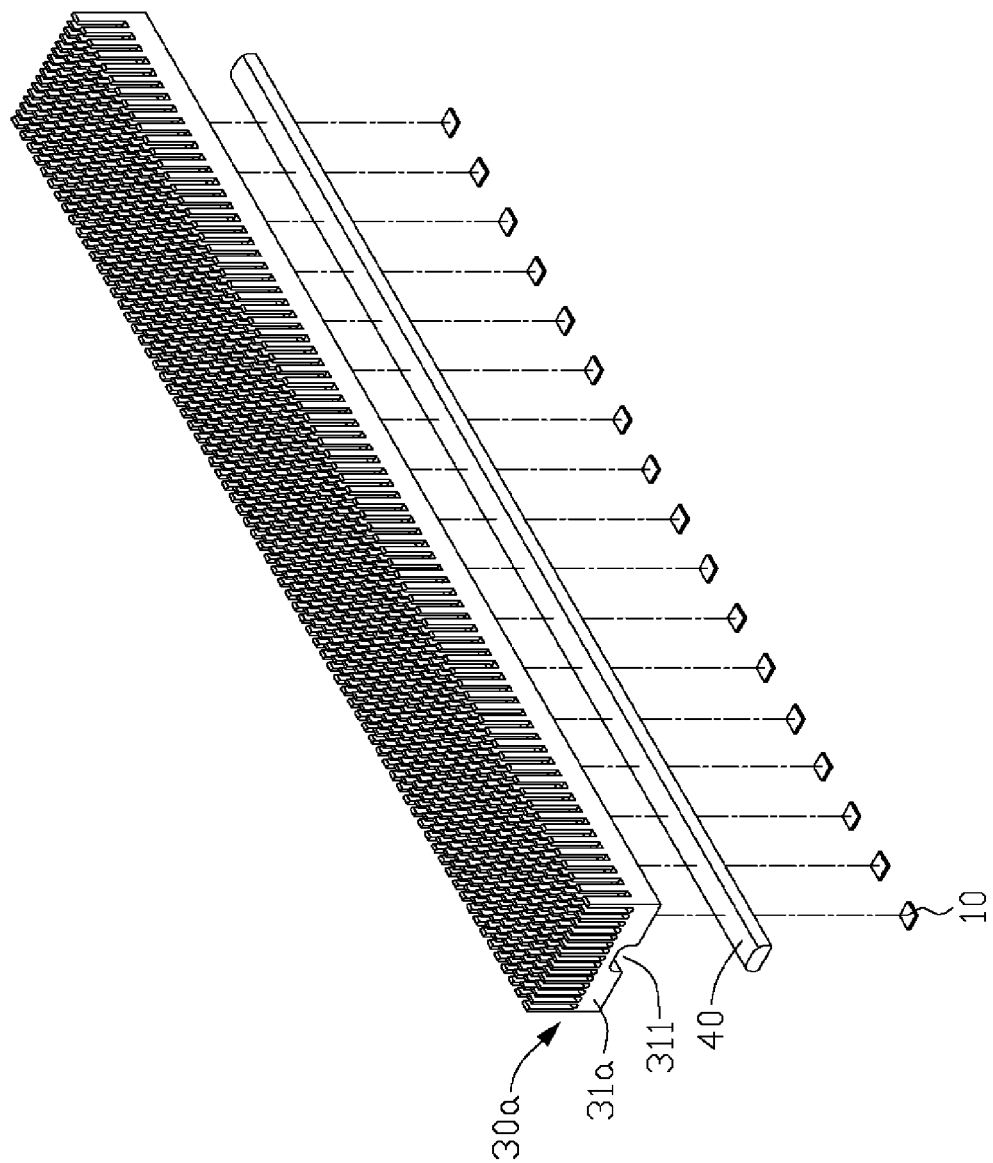
FIG. 4 is an exploded, isometric view of the LED assembly in accordance with a second embodiment of the present invention.
Figure 5:
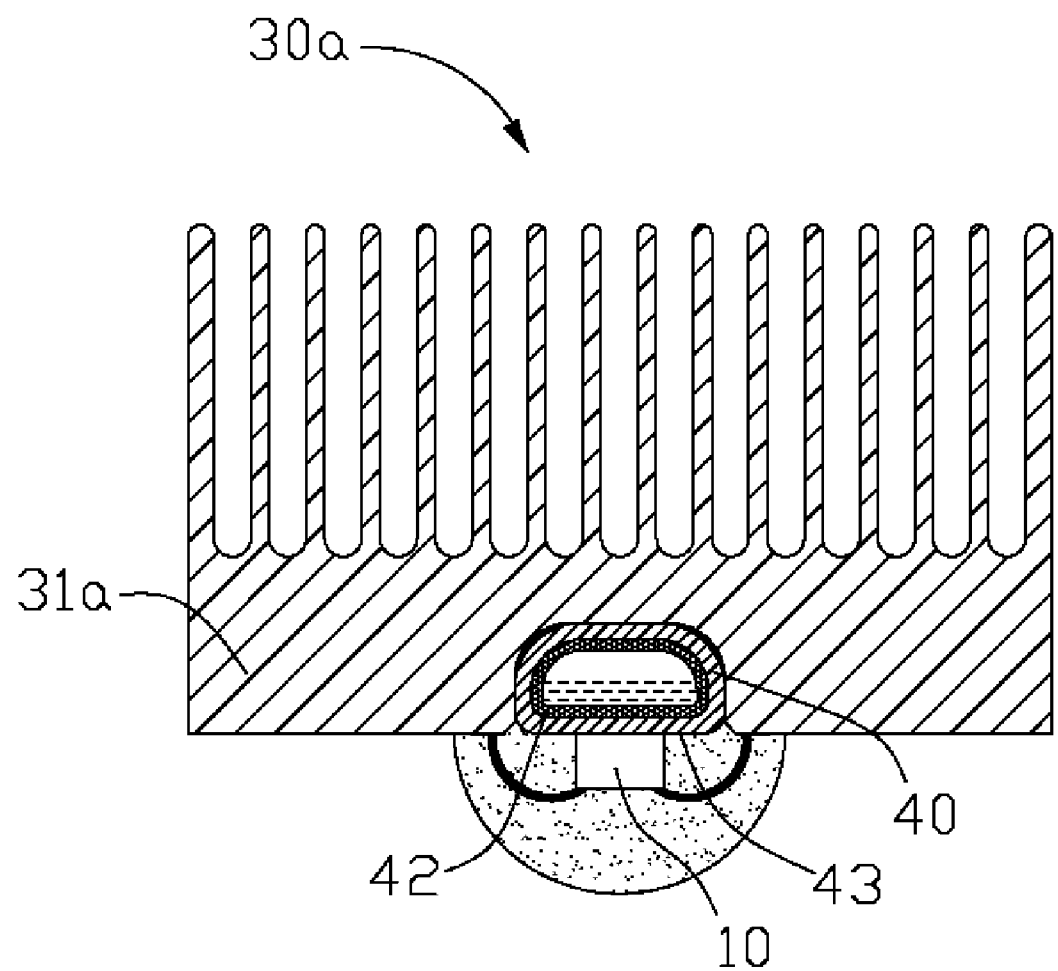
FIG. 5 is a cross-sectional view of FIG. 4 taken along a transverse direction thereof.

FIGS. 4-5 illustrate a second embodiment of the LED assembly. The difference between the second embodiment and the first embodiment is that the heat dissipation device further includes a plate-type heat pipe 40. The heat pipe 40 generally includes a hollow and vacuumed pipe body (not labeled) containing a working fluid, such as water or alcohol therein. A wick structure 42 is connected to an inner surface of the heat pipe 40. Top and bottom outer surfaces of the pipe body are both planar-shaped. The bottom surface of the heat pipe 40 forms a connecting surface 43 as the connecting surface 33 of the chassis 31 of the heat sink 30 of the first embodiment. The circuitry 20 of FIG. 3 is also formed on the connecting surface 43 of the heat pipe 40. A heat sink 30a is thermally attached to the top surface of the heat pipe 40. For increasing a contacting area of the heat pipe 40 and the heat sink 30a, a chassis 31a of the heat sink 30a defines an elongated groove 311 in a bottom surface thereof. The groove 311 has a shape conforming to that of the heat pipe 40 and thus can receive the heat pipe 40 therein.

During operation, as the heat generated by the LEDs 10, which are attached to the connecting surface 43, is transferred to the heat pipe 40, the working fluid contained therein absorbs the heat and evaporates into vapor. Since the vapor spreads quickly, it quickly fills an interior of the heat pipe 40, and whenever the vapor comes into contact with cooler walls of the heat pipe 40 (i.e., the top surface of the heat pipe 40) which thermally contact with the heat sink 30a, it releases the heat to the heat sink 30a. After the heat is released, the vapor condenses into liquid, which is then brought back by the wick structure 42 to the evaporating region, i.e., the connecting surface 43 of the heat pipe 40. Since the heat pipe 40 transfers the heat by using phase change mechanism involving the working fluid, the heat transferred to the heat pipe 40 from the LED dies 14 is thus rapidly and evenly distributed over the entire heat pipe 40 and is then conveyed to the heat sink 30a through which the heat is dissipated into ambient air. Obviously, multiple heat pipes 40 can be used to increase the heat dissipation efficiency for the LED assembly. For example, two or more heat pipes 40 can be thermally attached to the chassis 31a of the heat sink 30a. Also the chassis 31a of the heat sink 30a can define more grooves 311 for receiving the heat pipes 40 therein.

Figure 6:
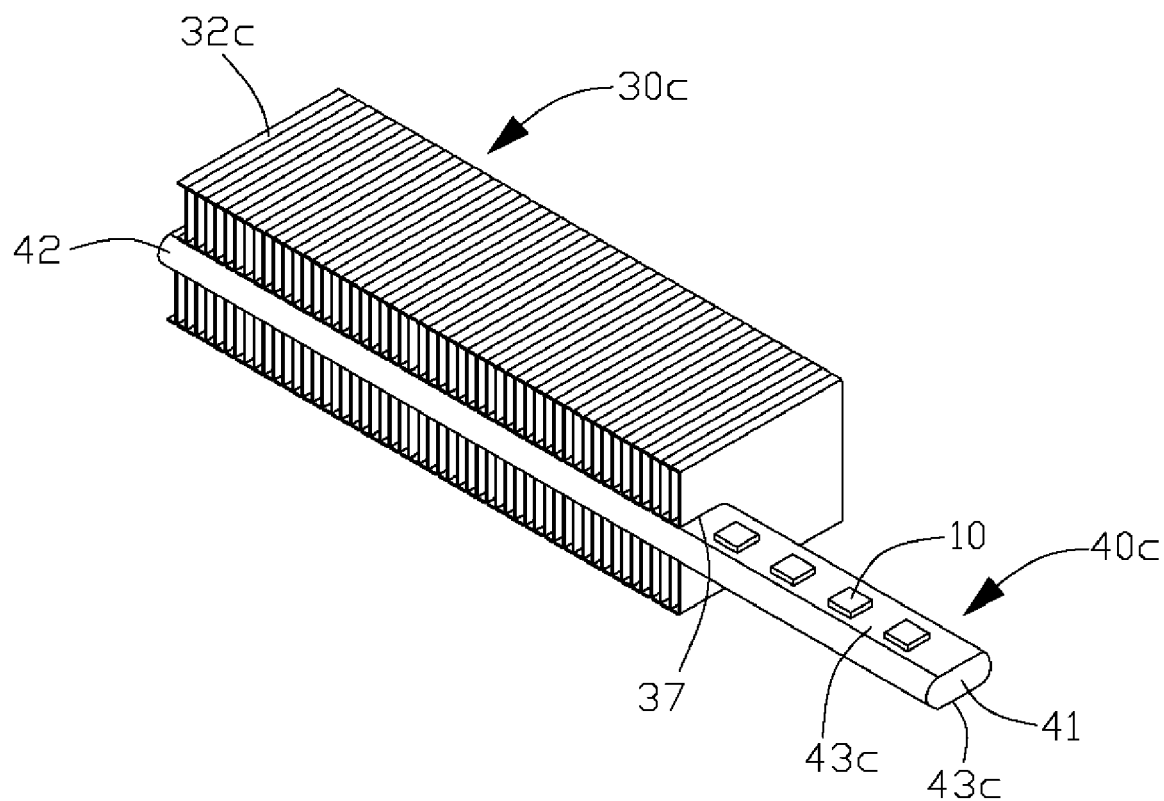
FIG. 6 is an assembled, isometric view of the LED assembly in accordance with a third embodiment of the present invention.
Figure 7:
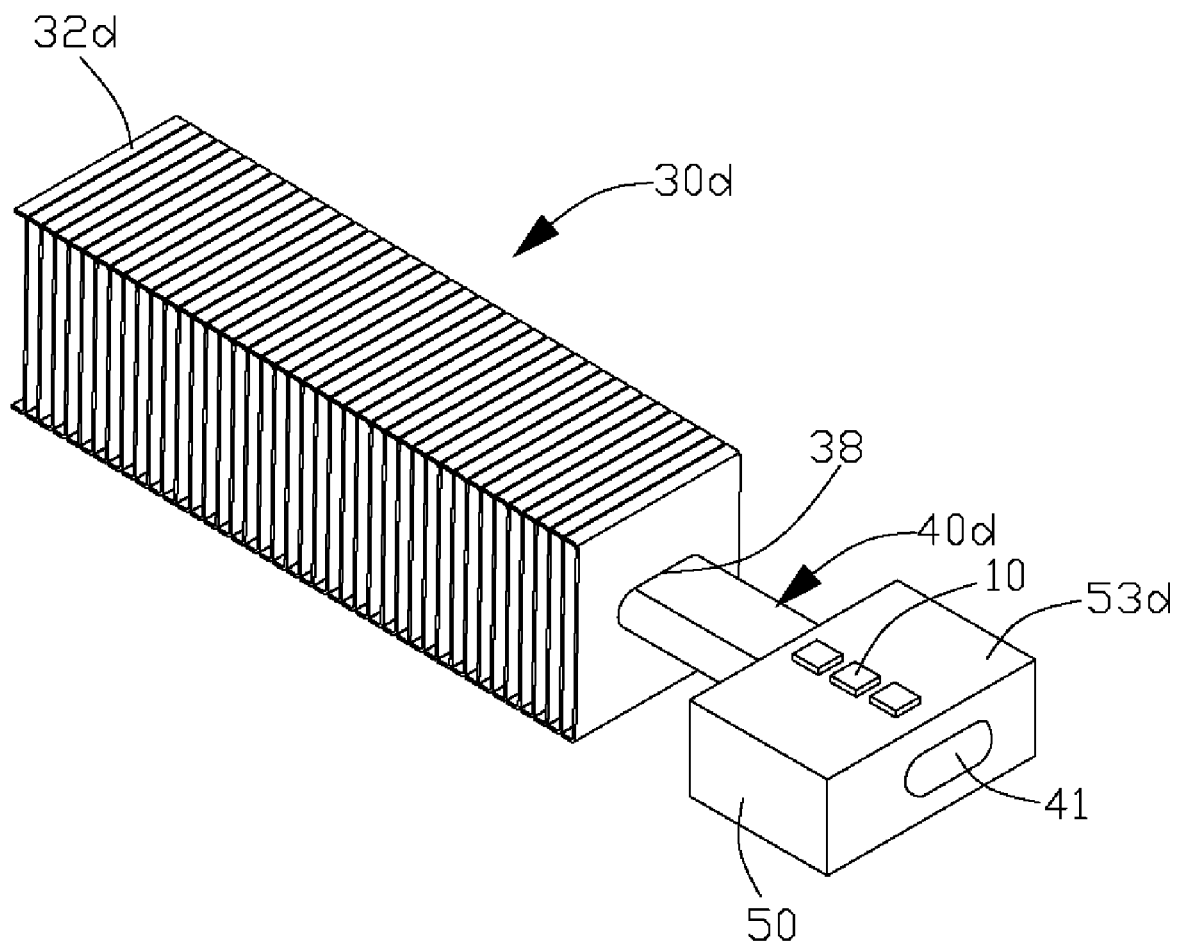
FIG. 7 is an assembled, isometric view of the LED assembly in accordance with a fourth embodiment of the present invention.

The heat pipe 40 is a heat transfer device having a relatively high heat transfer capability due to the phase change mechanism used. The heat pipe 40 has the advantage of low thermal resistance and is capable of transferring a large amount of heat while maintaining a low temperature gradient between different sections thereof. FIGS. 6-7 show third and fourth embodiments of the LED assemblies which also use heat pipes 40c, 40d to transfer the heat of the LEDs 10.

As shown in FIG. 6, the heat pipe 40c has an elongated, substantially rectangular shape. Two opposite ends of the heat pipe 40c respectively form an evaporating section 41 and a condensing section 42. Top and bottom surfaces of the evaporating section 41 of the heat pipe 40c are planar-shaped, and each forms a connecting surface 43c on which the circuitry 20 of FIG. 3 is directly formed. Thus more LEDs 10 can be mounted on a signal heat pipe 40c for the two connecting surfaces 43c thereof. A heat sink 30c includes a plurality of flat fins 32c stacked together. Each of the fins 32c defines a cutout in a lateral side thereof. Cooperatively the cutouts define a groove 37 receiving the condensing section 42 of the heat pipe 40c therein.

FIG. 7 shows the fourth embodiment of the LED assembly, which includes a heat dissipation device having a heat spreader 50, a heat pipe 40d and a heat sink 30d. Top and a bottom surfaces of the heat spreader 50 form connecting surfaces 53d for the LEDs 10 to be mounted thereon. The circuitry 20 of FIG. 3 is directly formed on each of the connecting surfaces 53d of the heat spreader 50 with the LED dies 14 being electrically connected thereto. An evaporating section 41 of the heat pipe 40d is received in the heat spreader 50 to absorb the heat generated by the LEDs 10. The heat sink 30d includes a plurality of flat fins 32d. Each fin 32d defines a hole (not labeled) in a central portion thereof. Cooperatively the holes of the fins 32d define a groove 38 for extension of a condensing section (not labeled) of the heat pipe 40d therethrough. Thus the fins 32d surround the condensing section of the heat pipe 40d, and the heat of the heat pipe 40d absorbed from the LEDs 10 can be more evenly distributed over the fins 32d.

Figure 8:
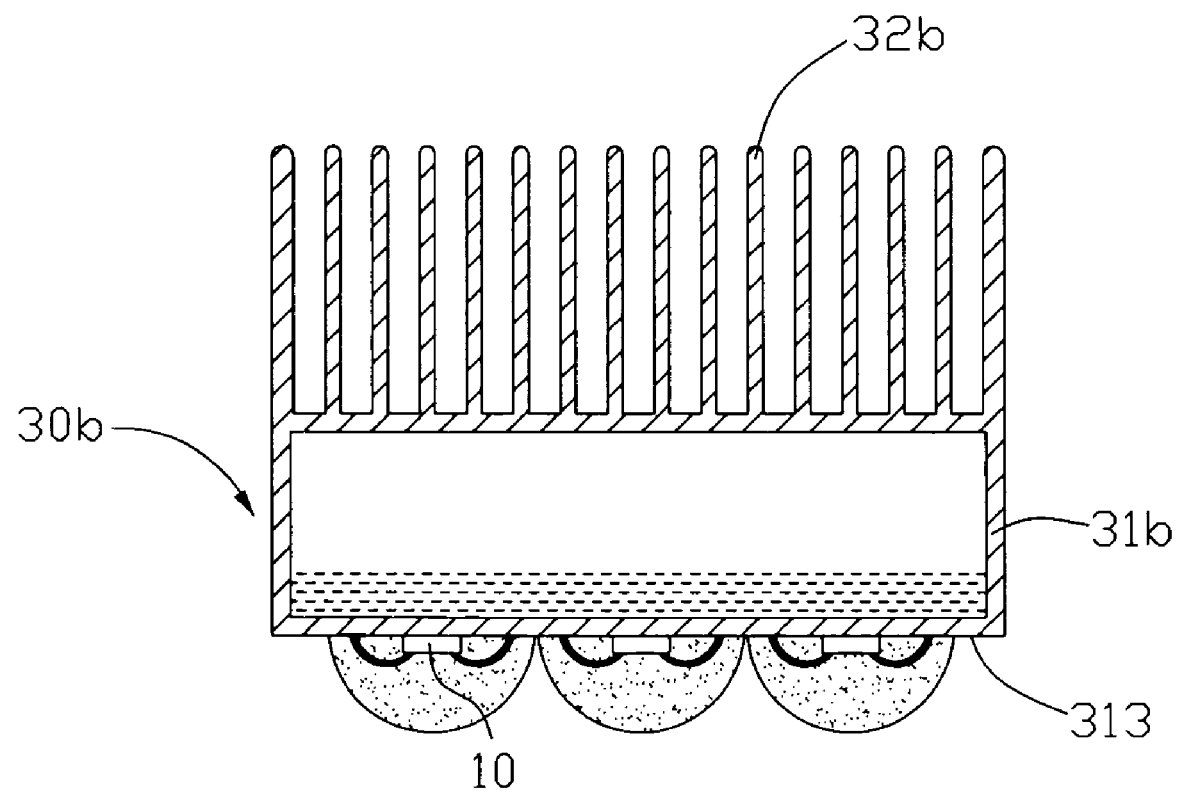
FIG. 8 is a cross-sectional view of the LED assembly in accordance with a fifth embodiment of the present invention.

FIG. 8 illustrates a fifth embodiment of the present LED assembly, in which a vapor chamber 30b is provided. The vapor chamber 30b has a much larger size than the heat pipe 40, 40c, 40d shown in the previous embodiments. The vapor chamber 30b has a chassis 31b with a top surface from which a plurality of fins 32b extend upwardly and a flat bottom surface to form a connecting surface 313 on which the circuitry 20 of FIG. 3 is formed directly. The LEDs 10 are electrically connected with the circuitry 20 and are maintained in thermal and physical contact with the connecting surface 313 of the vapor chamber 30b. The vapor chamber 30b also contains a working fluid therein and also employs a phase change mechanism to transfer heat. The heat from the LED dies 14 is directly transferred to the vapor chamber 30b and then is transferred from the vapor chamber 30b to the fins 32b for dissipation. As the vapor chamber 30b has a much larger size, more LEDs 10 can be provided to the assembly so as to increase the overall lighting brightness. In this embodiment, there are three LED arrays mounted on the connecting surface 313 of the vapor chamber 30b for heat dissipation.

Figure 9:
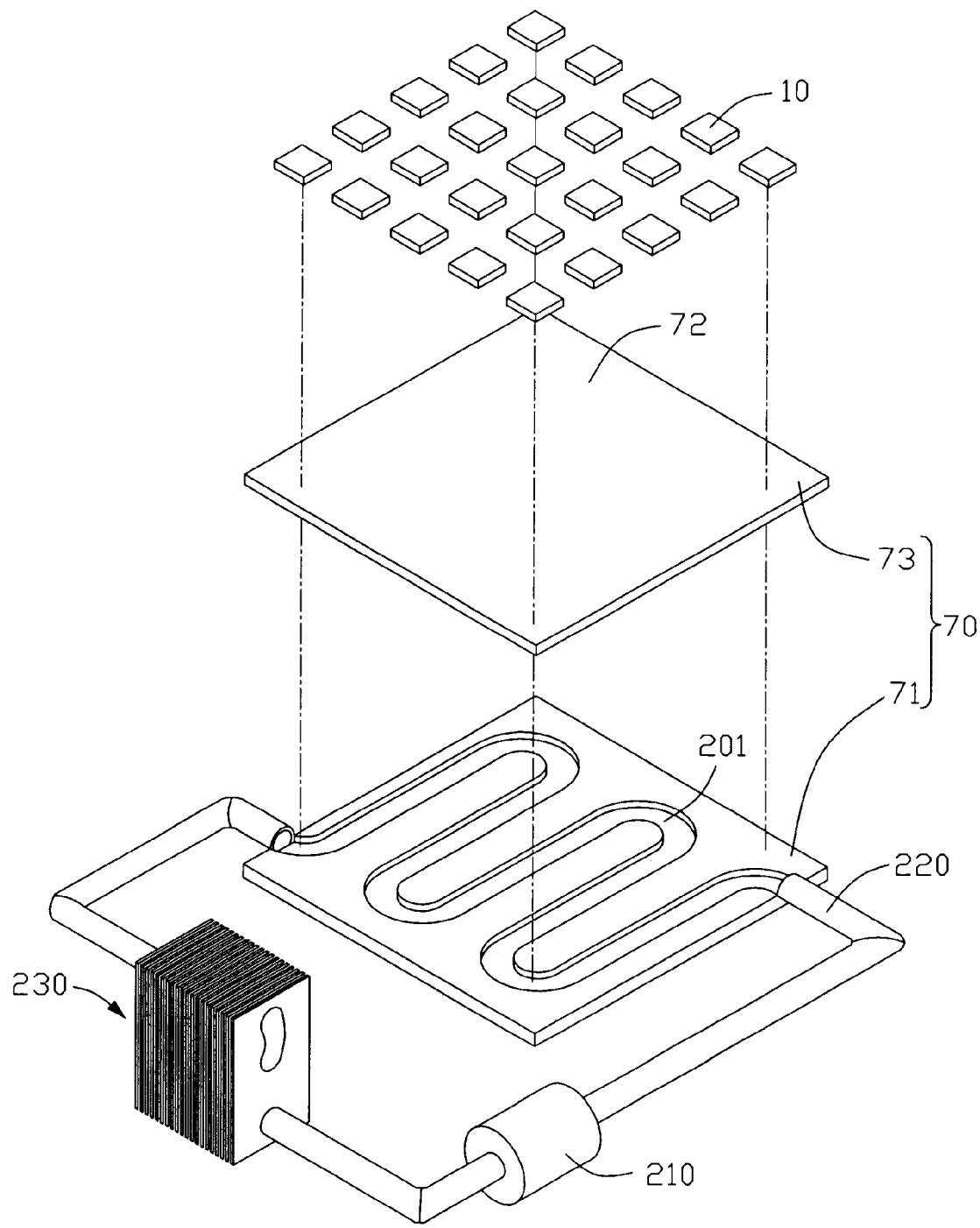
FIG. 9 is an exploded, isometric view of the LED assembly in accordance with a sixth embodiment of the present invention.

FIG. 9 shows a sixth embodiment of the present LED assembly. The LED assembly in this embodiment employs a liquid cooling system to dissipate the heat generated by the LEDs 10. The liquid cooling system includes a cold plate 70 through which a working fluid such as water (hereafter called "coolant") is circulated, a pump 210, a heat exchanger 230 and a plurality of connecting pipes 220. The cold plate 70 includes a base 71 and a cover 73 mounted on the base 71. Cooperatively the base 71 and the cover 73 define a hollow body receiving the coolant therein. A flow channel 201 is defined in the hollow body of the cold plate 70 for passage of the coolant. The flow channel 201 is wave-shaped in order to increase heat exchange area between the coolant and the cold plate 70. A top surface of the cover 73 of the cold plate 70 forms a connecting surface 72. The circuitry 20 of FIG. 3 is directly formed on the connecting surface 72. The LEDs 10 are electrically connected with the circuitry 20 and are maintained in thermal and mechanical contact with the connecting surface 72 of the cover 73 of the cold plate 70. As the coolant passes through the flow channel 201, it receives the heat generated by the LEDs 10. The pump 210 drives the coolant to flow into the connecting pipes 220 through which the coolant is guided to the heat exchanger 230 where the heat in the coolant is released. Thereafter, the cooled coolant is sent back by the pump 210 to the cold plate 70 where it is again available for absorbing heat from the LEDs 10 again.

According to the foregoing embodiments of the present LED assembly, the circuitry 20 is directly formed on the heat dissipation device (i.e., the heat sink 30, the heat spreader 50, the heat pipe 40, 40c, the vapor chamber 30b, or the cold plate 70). The LED dies 14 of the LEDs 10 are electrically connected with the circuitry 20 and are maintained in thermal and mechanical contact with the connecting surface 33, 43, 43c, 53d, 313, 72 of the heat dissipation device. The PCB is thus no longer needed. The heat resistance formed either between the LEDs and the printed circuit board (PCB), or between the PCB and the heat dissipation device of the conventional LED assembly is thus avoided. The heat of the LEDs 10 may therefore be quickly removed to improve lifespan of the LEDs 10. In particular, the heat pipe 40, the vapor chamber 30b, or the cold plate 70 has a hollow body which is filled with working fluid to directly absorb the heat from the LEDs 10. The heat is rapidly transferred from the LEDs 10 to the heat dissipation device for dissipation via a phase change mechanism or a rapid circulation of the working fluid in the heat-absorbing member, whereby the heat generated by the LED dies 14 of the LEDs 10 is efficiently and effectively removed. Also, the PCB can be omitted, which reduced cost in production and assembly of the LED assembly.

Figure 10:
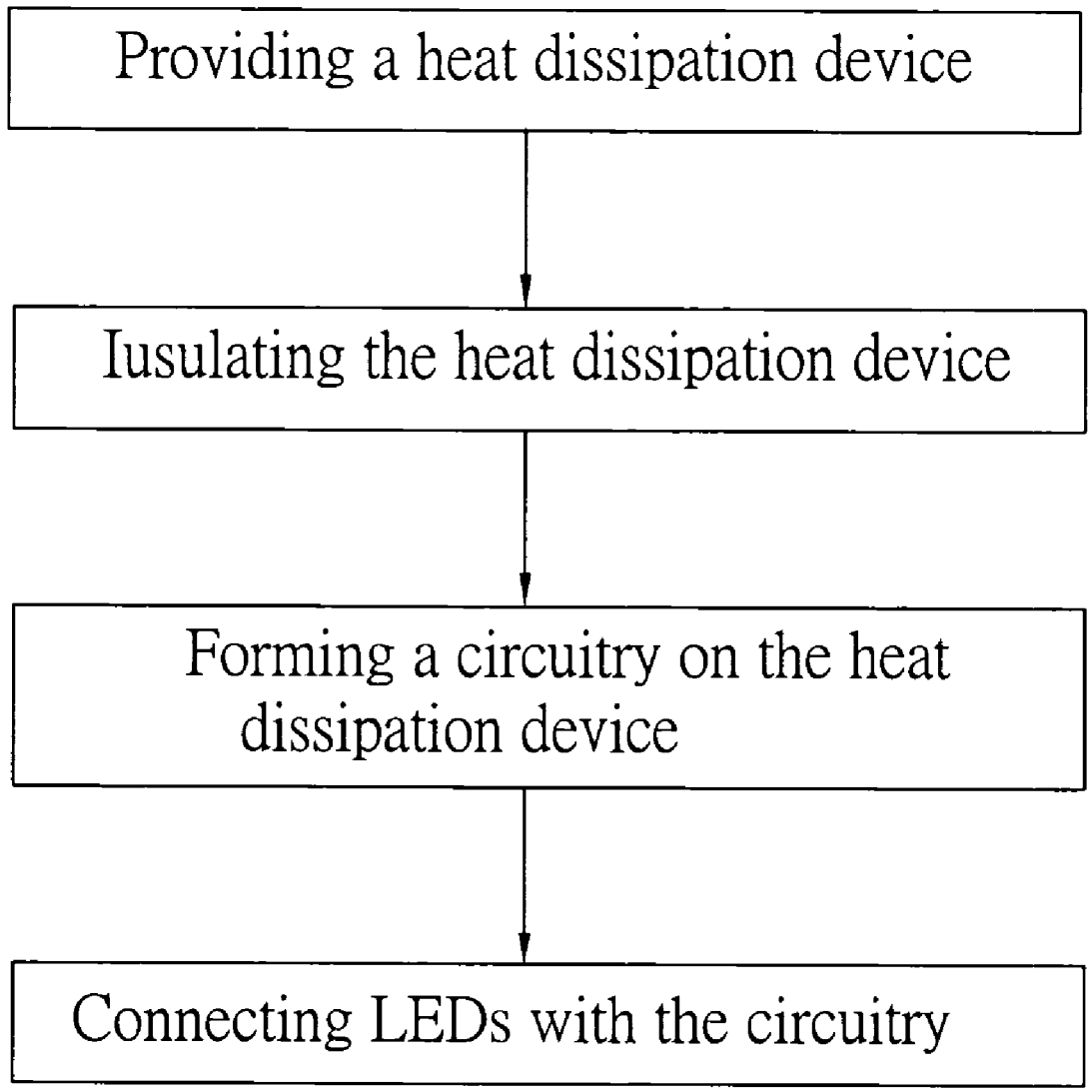
FIG. 10 is a flow chart showing a preferred method of making the LED assembly.

FIG. 10 shows a preferred method in accordance with the present invention for producing the LED assembly. Firstly, a heat dissipation device, such as a fin-type heat sink, a heat pipe, a vapor chamber or a cold plate is provided. In this embodiment, the heat dissipation device is the fin-type heat sink 30 of FIGS. 1-3, which includes the chassis 31 and the plurality of fins 32 extending therefrom. The heat sink 30 forms a planar-shaped bottom surface which is processed with cleaning, caustic scrubbing or burring so that the bottom surface can be firmly attached with an insulating layer. Then a very thin insulating layer is formed on the bottom surface of the heat sink 30 through vacuum sputtering, vaporization or anodizing.

The circuitry 20 of FIG. 3 is then formed on the insulating layer of the bottom surface of the heat sink 30 by the following steps. Firstly, a thin layer of copper foil is applied onto the insulating layer of the bottom surface so as to evenly cover the insulating layer. The copper foil layer can be formed on the insulating layer through sputtering, hot-pressing, electroless copper deposition, or electrodeposition. As material does not easily adhere to the insulating layer, surface activation is usually needed before forming the copper foil layer on the insulating layer. The surface activation usually includes silver spraying, sandblasting, and coursing. Thus the copper foil layer is easily applied to the insulating layer after surface activation. Then the circuitry 20 is formed on the bottom surface of the heat sink 30 by the copper foil layer through photoresist coating, exposing and etching. Alternatively, the circuitry 20 can be formed by stamping when the circuitry 20 has a relatively large thickness. The bottom surface of the heat sink 30 with the insulating layer and the circuitry 20 directly formed thereon forms the connecting surface 33.

The LEDs 10 now can be mounted onto the heat sink 30 to form the LED assembly. The LED dies 14 can be firstly packaged with the packaging layers 12 to form the LEDs 10. Then the LEDs 10 are maintained in thermal and mechanical contact with the connecting surface 33 of the heat sink 30 with the gold threads 16 of the LED dies 14 being electrically connected with the contacts 22 of the circuitry 20 through wire bonding. Alternatively, the LED dies 14 can be mounted on the connecting surface 33 of the heat sink 30 firstly, and the gold threads 16 of the LED dies 14 are electrically connected with the contacts 22 of the circuitry 20; then packing the LED dies 14 is processed to form the packaging layers 12 to encapsulate the LED dies 14.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light-emitting diode (LED) assembly, comprising:
a heat dissipation device comprising a sealed hollow body in which a working fluid is provided, an outer surface of the sealed hollow body forming a connecting surface having an insulating layer being integrally and directly coated thereon, a circuitry being integrally and directly formed on the insulating layer;
at least one LED die being electrically connected with the circuitry formed on the connecting surface, and being maintained in thermal and mechanical contact with the heat dissipation device to dissipate heat generated thereby through the heat dissipation device; and
a packaging layer encapsulating the at least one LED die, the packaging layer being connected to the insulating layer of the heat dissipation device integrally and directly;
wherein the heat dissipation device is a flat-type heat pipe with two opposite planar-shaped outer surfaces, the heat pipe having an evaporating section and a condensing section formed at two opposite ends thereof, at least one of the two opposite planar-shaped outer surfaces at the evaporating section of the heat pipe forming the connecting surface; and
wherein the LED assembly further comprises a heat sink having a chassis and a plurality of fins extending from a first outer side of the chassis, the chassis defining a groove at a second outer side opposite to the first outer side, the groove having a shape conforming to that of the heat pipe and receiving the heat pipe therein, the at least one of the two opposite planar-shaped outer surfaces which forms the connecting surface being substantially coplanar with the second outer surface of the chassis, and the other one of the two opposite planar-shaped outer surfaces of the heat pipe attaching to the chassis at a bottom of the groove.

* * * * *